(12) United States Patent
Chamas et al.

(10) Patent No.: US 7,990,978 B1
(45) Date of Patent: Aug. 2, 2011

(54) DYNAMIC BANDWIDTH QUEUE ALLOCATION

(75) Inventors: Haidar Chamas, White Plains, NY (US); William A. Bjorkman, Danbury, CT (US)

(73) Assignee: Verizon Services Corp., Ashburn, VA (US)

( * ) Notice: Subject to any disclaimer, the term of this patent is extended or adjusted under 35 U.S.C. 154(b) by 920 days.

(21) Appl. No.: 11/305,044

(22) Filed: Dec. 19, 2005

Related U.S. Application Data (60) Provisional application No. 60/637,281, filed on Dec. 17, 2004.

(51) Int. Cl.
*H04L 12/28* (2006.01)
*H04L 12/56* (2006.01)
*H04J 3/16* (2006.01)
*H04J 3/22* (2006.01)

(52) U.S. Cl. ......... 370/395.21; 370/395.41; 370/395.43; 370/468

(58) Field of Classification Search .................. 370/322, 370/329, 395.21, 395.4, 395.41, 395.42, 370/395.43, 468, 477
See application file for complete search history.

(56) References Cited

U.S. PATENT DOCUMENTS

| | | | | |
|---|---|---|---|---|
| 5,982,748 A * | 11/1999 | Yin et al. | | 370/232 |
| 6,122,289 A * | 9/2000 | Brown et al. | | 370/465 |
| 6,424,622 B1 * | 7/2002 | Fan et al. | | 370/230 |
| 6,510,160 B1 * | 1/2003 | Nikuie et al. | | 370/412 |
| 6,967,921 B1 * | 11/2005 | Levy et al. | | 370/230.1 |
| 6,978,144 B1 * | 12/2005 | Choksi | | 455/452.2 |
| 7,359,322 B2 * | 4/2008 | Khurana et al. | | 370/230 |
| 7,362,705 B2 * | 4/2008 | Beukema et al. | | 370/230 |
| 2004/0158644 A1 * | 8/2004 | Albuquerque et al. | | 709/238 |
| 2004/0165528 A1 * | 8/2004 | Li et al. | | 370/230 |
| 2004/0230675 A1 * | 11/2004 | Freimuth et al. | | 709/223 |
| 2005/0050246 A1 * | 3/2005 | Lakkakorpi et al. | | 710/36 |

OTHER PUBLICATIONS

IEEE Std 802.17-2004 "Resilient packet ring (RPR) access method and Physical layer specifications".
IEEE 802.1Q-2003 "IEEE Standards for Local Metropolitan Area Networks Virtual Bridged Local Area Networks".
IEEE 802.3-2002 "IEEE Standard for Information Technology-Telecommunications and Informaiton Exchange between systems-Local and Metropolitan area Networks-Specific Requirements; Part 3: Carrier sense multiple access with collision detection (CSMA/CD) access method and physical layer specifications".
IEEE 802.3AH-2004 "Part 3: Carrier Sense Multiple Access with Collision Dectection (CSMA/CD) Access Method and Physical Layer Specifications; Amendment: Media Access Control Parameters, Physical Layers, and Management Parameters for Subscriber Access Networks".
IETF RFC 3471 "Generalized Multi-Protocol Label Switching (GMPLS) Singnaling Functional Description".
IETF RFC 3473 "Generalized Multi-Protocol Label Switching (GMPLS) Signaliing Resource ReserVation Protocol-Traffic Engineering (RSVP-TE) Extensions".

(Continued)

*Primary Examiner* — Gregory B Sefcheck
*Assistant Examiner* — Ashley L Shivers (57) ABSTRACT

In one of many possible embodiments, a system includes a plurality of queues configured to share an amount of bandwidth, the amount of bandwidth being allocated between the queues in accordance with a plurality of queue weighting factors associated with the queues. The system further includes an admission control subsystem configured to dynamically adjust the queue weighting factors when a predefined condition has been satisfied. In certain embodiments, the admission control subsystem is configured to adjust the queue weighting factors based on a ratio of bandwidth provisioned on the plurality of queues. In certain embodiments, each of the queues is associated with a different class of service.

27 Claims, 3 Drawing Sheets

OTHER PUBLICATIONS

ITU-T G.7041-Y.1303 "Generic framing procedure (GFP)".
ITU-T G.7042 "Link capacity adjustment scheme (LCAS) for virtual concatenated signals".
ITU-T G.707 "Network node interface for the synchronous digital hierarchy (SDH)".
ITU-T G.7713-Y.1704 "Distributed call and connection mangement (DCM)".
ITU-T G 7715-Y.1706 "Architecture and requirements for routing in the automatically switched optical networks".
ITU-T G.7718-Y.1709 "Framework for ASON management".
ITU-T G.8080-Y.1304 "Architecture for the automaticallu switched optical network (ASON)".
MEF 6 "Ethernet Services Definitions—Phase 1".
oif2003 1 .293.03 "Draft UNI 2.0 Specification".
OIF2003.248.05 "User Network Interface (UNI) 1.0 Signaling Specification, Release 2: Common Part".
OIF2003.249.03 "RSVP Extensions for User Network Interface (UNI) 1.0 Signaling, Release 2".
The Yankee Group Report "U.S. Ethernet Services Market: A Slow Start, but Now Coming of Age" May 2004.

\* cited by examiner

DYNAMIC BANDWIDTH QUEUE ALLOCATION

RELATED APPLICATION

The present application claims priority under 35 U.S.C. §119(e) to U.S. Provisional Patent Application No. 60/637,281, by Haidar Chamas et al., filed on Dec. 17, 2004, and entitled DYNAMIC BANDWIDTH QUEUE ALLOCATION, the contents of which are hereby incorporated by reference in their entirety.

BACKGROUND INFORMATION

Packet-switched networks are used to transport data between computing devices. Typically, paths are formed over the packet-switched networks to communicatively connect devices together. The paths are made up of one or more links, with each link having a certain bandwidth capacity. The bandwidth capacity of each link may be divided for use by different classes of network services. For example, a certain amount of link bandwidth capacity may be allocated for a high-priority service class, and the remaining bandwidth may be allocated for a low-priority service class. Accordingly, network service providers are able to offer different levels of network services.

In existing networks, the amount of bandwidth allocated for each class of service is typically set at the time of initial link turn-up. Queue factors are generally used to set bandwidth allocations per class of service. For example, at the endpoints of each link, queues are configured to line up network traffic (e.g., service provisioning requests) for respective classes of service mapped to the queues. At link turn-up, the queues are assigned factors based on queue buffering rates, service level agreements, and forecasted demands for the respective classes of service. A scheduler uses the factors to weight the allocation of link bandwidth per class of service. Accordingly, the provisioning of network services associated with a particular class of service uses the bandwidth allocated for the class of service, as determined from queue factors, including queue weighting factors and other service and link parameters. In general, the allocated bandwidth is used as an upper limit to the amount of bandwidth allowed to be provisioned for a given class of service.

While traditional queuing techniques have improved link utilization efficiencies when actual service demands match forecasted demands, the static nature of queue factors can lead to network problems, including link failure, in particular circumstances. For example, when actual network service demands for a class of service vary from the forecasted demands used to determine queue factors, a given link may fail prematurely when the queue corresponding to the class of service becomes exhausted, even though there is sufficient bandwidth capacity in another queue, or a combination of other queues, to support the network service demands. Accordingly, overloading of any one queue associated with a particular class of service can cause a link to fail, even when bandwidth allocated for other classes of service is still available.

Moreover, traditional queuing techniques are typically applied globally to all links of a path or network, without considering the links on a link-by-link basis. Accordingly, bandwidth allocated for a class of service is usually the same for every link in a path or network. Because network services can usually be routed over more than one path, network links typically carry network traffic associated with communications between many different endpoints. In many situations, global allocation of bandwidth per service class is overly restrictive and does not provide link-by-link flexibility. For the reasons described above, link resources (e.g., bandwidth) often are not utilized efficiently, especially when, for any given link, actual network service demands differ from forecasted network service demands.

BRIEF DESCRIPTION OF THE DRAWINGS

The accompanying drawings illustrate various embodiments and are a part of the specification. The illustrated embodiments are merely examples and do not limit the scope of the disclosure. Throughout the drawings, identical reference numbers designate identical or similar elements.

DETAILED DESCRIPTION OF PREFERRED EMBODIMENTS

I. Overview

Preferred embodiments according to the present invention may be implemented as systems and methods for dynamically weighting queue allocations of bandwidth on links of a network. The present systems and methods may be used to dynamically adjust link bandwidth allocations between classes of service ("CoS") in a wide variety of different types of communication networks, including, but in no way limited to, wireless networks, cellular telephone networks, broadcast media networks, cable television networks, other television networks, satellite networks, Internet protocol based ("IP-based") networks, the Internet, proprietary networks, private networks, local area networks, metropolitan area networks, wide area networks, pico-networks, Ethernet services networks (e.g., metropolitan Ethernet networks), and other networks capable of carrying data packets or frames.

Bandwidth allocations for different classes of service may be adjusted by dynamically changing the values of queue weighting factors associated with queues to which the classes of service are mapped. Queue weighting factors may be adjusted on a link-by-link basis and in accordance with a ratio of bandwidth provisioned on the queues. By dynamically adjusting bandwidth allocations between classes of service, link utilization efficiencies can be improved in many circumstances, especially circumstances in which actual network demands differ from forecast demands.

Dynamic queue weighting may be initiated upon satisfaction of a predefined condition. For example, when provisioned bandwidth for a class of service reaches a predefined provisioned bandwidth threshold, dynamic queue weighting may be initiated. By way of another example, dynamic queue weighting may be initiated when it is determined that a class of service has insufficient bandwidth available to provision a service request. Exemplary systems and methods will now be described in more detail.

II. Exemplary System

Figure 1:
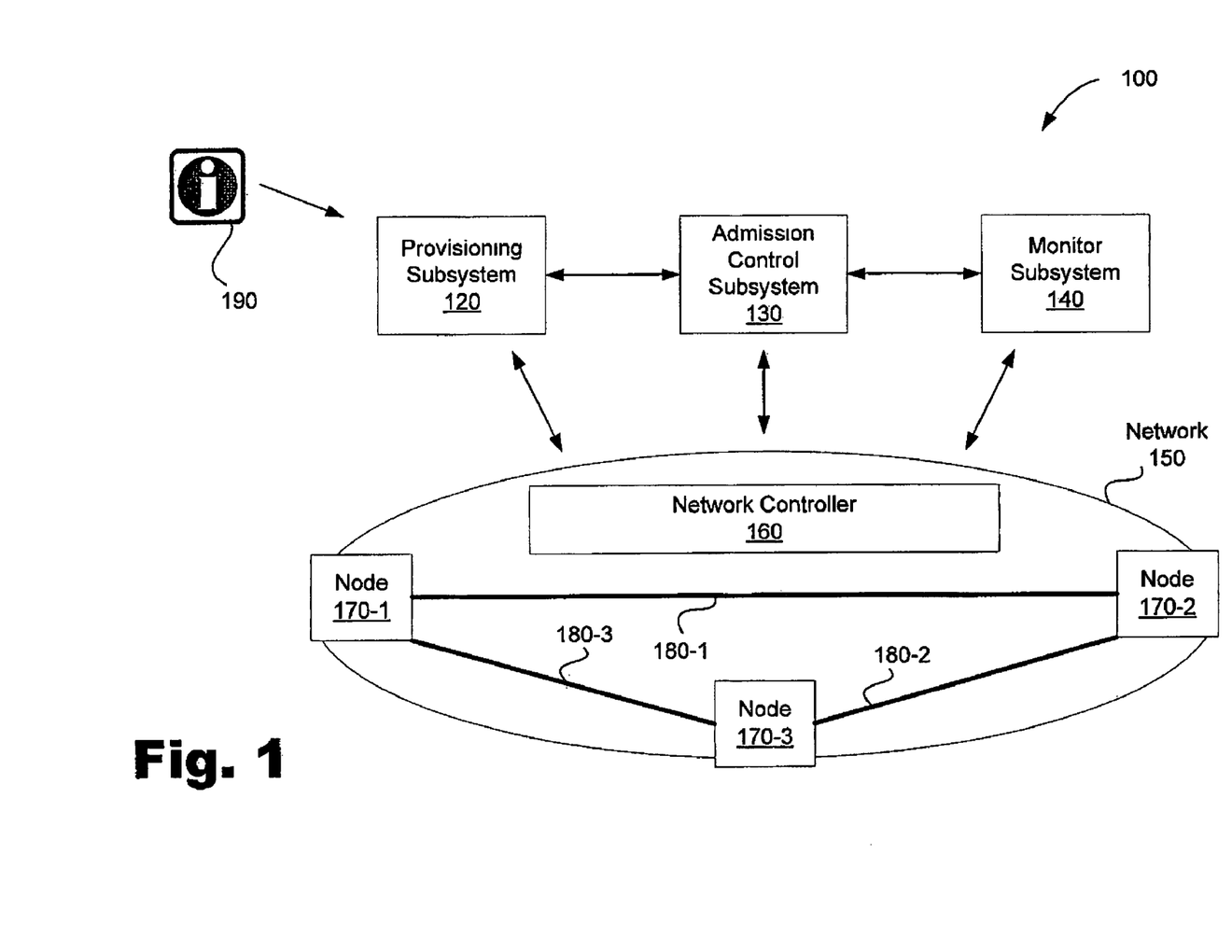
FIG. 1 is a block diagram illustrating an exemplary dynamic bandwidth queue allocation system, according to an embodiment.

Turning now to the figures, FIG. 1 is a block diagram illustrating an exemplary dynamic bandwidth queue allocation system 100 (or simply "system 100"), according to an embodiment. As shown in FIG. 1, the system 100 may include provisioning subsystem 120, admission control subsystem 130, and monitor subsystem 140 communicatively coupled to one another and to network 150 as shown in the Figure. Network 150 may include network controller 160, as well as nodes 170-1, 170-2, and 170-3 (collectively "nodes 170") interconnected by links 180-1, 180-2, and 180-3 (collectively "links 180") as shown in the Figure. Network controller 160 may be configured to communicate with provisioning subsystem 120, admission control subsystem 130, and monitor subsystem 140 as shown. Network controller 160 may also be configured to communicate with nodes 170, including setting queue factors associated with nodes 170.

System 100 may receive and provision requests for network services on network 150. For example, provisioning subsystem 120 may receive request 190, and system 100 may use information included in request 190, as well as other information descriptive of the status of network 150 (e.g., current service demands and/or performance levels) to provision or not provision the requested network service in a manner that enhances the efficiency of network 150.

The elements shown in FIG. 1 may be implemented as software, hardware, firmware, or combinations thereof. In many embodiments, the elements shown in FIG. 1 include or are in the form of software or firmware modules configured to be executed on one or more computing devices. Thus, system 100 may be implemented on more than one physical computing device. In particular, provisioning subsystem 120, admission control subsystem 130, and monitor subsystem 140 may be included in or implemented on one or more computing devices, such as one or more servers. Physical computing devices of system 100 may include any computing devices known to those skilled in the art, including, but not limited to, switches, routers, gateways, servers, digital subscriber line access multiplexers ("DSLAMs"), network interface devices ("NIDs"), set-top boxes, DSL modems, and user network interface ("UNI") devices. Physical computing devices of system 100 may employ any of a number of computer operating systems known to those skilled in the art, including, but by no means limited to operating systems known for their use in network devices.

Accordingly, those skilled in the art will recognize that the processes described herein may be implemented at least in part as instructions executable by one or more computing devices. In general, a processor (e.g., a microprocessor) receives instructions, e.g., from a memory, a computer-readable medium, etc., and executes those instructions, thereby performing one or more processes, including one or more of the processes described herein. Such instructions may be stored and transmitted using a variety of known computer-readable media.

A computer-readable medium (also referred to as a processor-readable medium) includes any medium that participates in providing data (e.g., instructions) that may be read by a computing device (e.g., by a processor of a computer). Such a medium may take many forms, including, but not limited to, non-volatile media, volatile media, and transmission media. Non-volatile media may include, for example, optical or magnetic disks and other persistent memory. Volatile media may include, for example, dynamic random access memory ("DRAM"), which typically constitutes a main memory. Transmission media may include, for example, coaxial cables, copper wire and fiber optics, including the wires that comprise a system bus coupled to a processor of a computer. Transmission media may include or convey acoustic waves, light waves, and electromagnetic emissions, such as those generated during radio frequency ("RF") and infrared ("IR") data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

While FIG. 1 illustrates an exemplary system 100, other implementations may be used. In other embodiments, additional elements may be included, or the elements shown in FIG. 1 may be omitted or modified. For example, monitor subsystem 140 may be omitted from certain embodiments. Each of the elements shown in FIG. 1 will now be described in more detail.

A. Network

Network 150 may include one or more packet-switched networks capable of dynamically provisioning bandwidth, including, for example, one or more optical transport networks such as the next generation optical transport network described in U.S. patent application Ser. No. 11/224,502, by Stephen Liu et al., filed on Sep. 12, 2005, and entitled SYSTEMS AND METHODS FOR POLICY-BASED INTELLIGENT PROVISIONING OF OPTICAL TRANSPORT BANDWIDTH (hereinafter referred to as "U.S. patent application Ser. No. 11/224,502"), the contents of which are hereby incorporated by reference in their entirety. Network 150 may be configured to add additional bandwidth capacity to one or more links as described in U.S. patent application Ser. No. 11/224,502, the contents of which have been incorporated by reference in their entirety, or in any manner known to those skilled in the art Network 150 may include, but is not limited to, one or more local area networks, metropolitan area networks, and wide area networks. In certain embodiments, network 150 may include one or more Ethernet networks (e.g., a metropolitan Ethernet network) configured to provide Ethernet services, including, but not limited to, switched Ethernet services designed to support local area network interconnection applications, multipoint Ethernet connections, and point-to-point private Ethernet line connections. For example, network 150 may provide Ethernet virtual connections ("EVCs") to communicatively connect local area networks or other network interfaces (e.g, nodes 170) over network 150. Link bandwidth may be provisioned by provisioning one or more EVCs. Of course, other types of network services may be provided over network 150, including dedicated Synchronous Optical Network ("SONET") rings and access connections to a Multiprotocol Label Switching ("MPLS") backbone, for example.

1. Nodes

Nodes 170 may include any network elements (e.g., network devices) capable of sending and receiving communications over network 150. Nodes 170 may include, but are not limited to, local area networks, user network interfaces ("UNIs"), switches, routers, gateways, and any network element described in U.S. patent application Ser. No. 11/224, 502, the contents of which have been incorporated by reference in their entirety.

Nodes 170 may include queues and schedulers (e.g., see FIG. 2) configured to line up the provisioning of network services over links 180, including the provisioning of bandwidth associated with requested network services. The queues may be associated with different classes of service. In certain embodiments, for example, each class of service available over a particular link 180 is mapped to a particular queue at an endpoint (e.g., a particular node 170) of the link

180. An exemplary configuration of queues and schedulers will be described below in reference to FIG. 2.

While FIG. 1 shows the three nodes 170 included in network 150, this is for illustration only and not limiting. Indeed, network 150 may include one or more nodes 170 interconnected by one or more links 180 in any suitable configuration. Moreover, network 150 may include access points to other networks, including an MPLS backbone, as mentioned above. In addition, nodes 170 may be arranged in any suitable configuration, including spanning tree configurations such as the exemplary spanning tree topology described in U.S. Provisional Patent Application No. 60/637,281, by Haidar Chamas et al., filed on Dec. 17, 2004, and entitled DYNAMIC BANDWIDTH QUEUE ALLOCATION, the contents of which have been incorporated by reference in their entirety.

2. Links

Links 180 may be configured to carry communication signals between nodes 170. Links 180 may comprise any suitable transmission medium or media, including, for example, optical transport media. In certain embodiments, links 180 comprise fiber-optic transmission media.

A particular link (e.g., link 180-1) typically connects two nodes (e.g., nodes 170-1 and 170-2). One or more links 180 may form a communication path between two nodes 170. For example, link 180-1 forms a communication path between nodes 170-1 and 170-2, and links 180-2 and 180-3 combine to form another communication path between nodes 170-1 170-2.

Network services can be carried out over links 180, including network services associated with the provisioning of bandwidth for use in transporting specific communication signals. For example, links 180 may support the dynamic provisioning and tearing down of Ethernet virtual circuits or other types of communication channels.

Each of the links 180 has a bandwidth capacity, which generally refers to the bandwidth capacity of the link without oversubscription factors being applied to the link. The bandwidth capacity may include the actual physical capacity of a link or a predefined amount of bandwidth to be used for certain network services and/or data transportation.

The bandwidth capacity of each link 180 may be allocated across one or more classes of service. For example, the bandwidth capacity of link 180-1 may be evenly allocated across three classes of service, with one third of the bandwidth capacity being allocated to each class of service. Of course, other bandwidth allocations (e.g., 10% for a first class of service, 40% for a second class of service, and 50% for a third class of service) may be used.

Bandwidth allocations for classes of service on each link 180 may be set to initial values (e.g., default values). For example, upon link turn-up, each class of service may be allocated a predetermined amount of bandwidth on a particular link 180. Initial bandwidth allocations may be based on forecast network service demands and any other parameters useful for predicting suitable bandwidth allocations across classes of service. Initial bandwidth allocations may be defined by setting values for queue weighting factors associated with the queues to which the classes of service are mapped. The values of the queue weighting factors define an initial ratio of bandwidth allocations between the classes of service. A user may manually set initial bandwidth allocation values, or system 100 may be configured to automatically initialize queue weighting factors to predefined values. As will be described in detail further below, system 100 can dynamically adjust the bandwidth allocations between classes of service to enhance link utilization efficiency.

3. Network Controller

Network controller 160 may be configured to control provisioning and tearing down of network services over network 150. For example, network controller 160 may receive provisioning instructions from provisioning subsystem 120 and/or admission control subsystem 130. Network controller 160 may then process (e.g., translate) and forward the instructions to any of the nodes 170, which are configured to carry out the provisioning instructions. Network controller 160 may also forward other instructions between nodes 170, provisioning subsystem 120, admission control subsystem 130, and monitor subsystem 140.

Network controller 160 may forward network status signals from nodes 170 to provisioning subsystem 120, admission control subsystem 130, and/or monitor subsystem 140. This enables system 100 to actively monitor current service demands and network parameters occurring on network 150. For example, monitor subsystem 140 may receive network status signals from network controller 160. Alternatively, monitor subsystem 140 may be configured to collect status signals directly from nodes 170.

Network controller 160 may employ any suitable technologies for communicating with nodes 170, publishing subsystem 120, admission control subsystem 130, and monitor subsystem 140, including any communication technologies described in U.S. patent application Ser. No. 11/224,502, the contents of which have been incorporated by reference in their entirety.

Network controller 160 may include or be in the form of a network control plane distributed over nodes 170 of network 150. For example, network controller 160 may include a control plane such as the intelligent control plane described in U.S. patent application Ser. No. 11/224,502, the contents of which have been incorporated by reference in their entirety.

B. Provisioning Subsystem

Provisioning subsystem 120 may include one or more devices (e.g., servers) capable of receiving network service requests and communicating with admission control subsystem 130 and network controller 160. Provisioning subsystem 120 may employ any suitable communication technologies for receiving service requests and for communicating with admission control subsystem 130 and network controller 160.

Provisioning subsystem 120 may be configured to issue service provisioning commands to network controller 160. Network controller 160 and other elements of network 150 can carry out the provisioning commands in any of the ways described in U.S. patent application Ser. No. 11/224,502, the contents of which have been incorporated by reference in their entirety.

Provisioning subsystem 120 may be configured to track the status of bandwidth capacity, allocation, provisioning, and availability on links 180 of network 150. For example, provisioning subsystem 120 may use provisioning commands to create and maintain a record of up-to-date bandwidth information for each link 180 on network. The record may be searchable by link and/or class of service. Accordingly, for each link 180, provisioning subsystem 120 can track the amount of allocated, provisioned, and available bandwidth per class of service. System 100 can use this information (e.g., amounts of bandwidth provisioned for each class of service) to help determine provisioning actions and values of queue weighting factors that promote efficient bandwidth allocation and link utilization.

As shown in FIG. 1, provisioning subsystem 120 may receive request 190, which typically includes information related to a request for one or more network services (e.g., provisioning of an Ethernet virtual connection) over network 150. Request 190 may include node identifiers (e.g., node identifiers for source and destination nodes 170), a class-of-service identifier, bandwidth information associated with the identified classes of service (e.g., allowable bandwidth identifiers and/or an amount of bandwidth being requested for the class of service), and any other information potentially useful for establishing and/or carrying out a network service. For example, a particular request for a network service between nodes 170-1 and 170-2 may include identifiers for nodes 170-1 and 170-2, a class-of-service identifier indicative of the class of service to be used for the network service, and bandwidth information associated with the class of service.

Provisioning subsystem 120 may process the information included in request 190, including performing translations of the information. Provisioning subsystem 120 may forward any of the information included in request 190 to admission control subsystem 130. Provisioning subsystem 120 may also provide other information to admission control subsystem, including any information descriptive of current network conditions. For example, provisioning subsystem 120 may provide information descriptive of the current capacity, allocation, provisioning, and availability of bandwidth on any link 180 of network 150. Allocation, provisioning, and availability information may be per class of service.

Accordingly, any information maintained by provisioning subsystem 120 may be provided to admission control subsystem 130, including in response to admission control subsystem 130 requesting the information. Admission control subsystem 130 can process the information received from provisioning subsystem 120 as described below and provide a result to provisioning subsystem 120. For example, admission control subsystem 130 may indicate to provisioning subsystem 120 whether the requested network service has been granted or denied admission on network 150, or instruct provisioning subsystem 120 to wait for subsequent instructions.

If the requested network service has been denied admission on network 150 or has been put in a wait state, provisioning subsystem 120 may notify a requestor of the service denial or wait state and optionally provide reasons for the denial or wait state. On the other hand, if the network service has been approved for admission on network 150, provisioning subsystem 120 may instruct network controller 160 to carry out the network service on network 150. For example, provisioning subsystem 120 may instruct network controller 160 to provision bandwidth allocated to a particular class of service on or more links 180 for the network service (e.g., and Ethernet virtual connection).

C. Monitor Subsystem

Monitor subsystem 140 may include one or more devices (e.g., servers) capable of monitoring network performance and/or communicating with admission control subsystem 130 and network controller 160. Monitor subsystem 140 may employ any suitable communication technologies for communicating with admission control subsystem 130 and network controller 160.

Monitor subsystem 140 may be configured to determine (e.g., monitor and/or calculate) current network parameters, including, but not limited to, link utilization, loss, jitter, delay, and any other information descriptive of the status of network services on network 150. The parameters may be determined per class of service (i.e., per queue).

The parameters may be determined on demand or over a predetermined time interval. In certain embodiments, for example, monitor subsystem 140 is configured to monitor link utilization for each queue over a predetermined time interval.

Monitor subsystem 140 may employ any suitable network performance monitoring technologies, including external, distributed, or third-party performance monitoring applications and/or devices. For example, monitor subsystem 140 may employ any techniques associated with one-way and/or two-way active measurement protocols ("OWAMP" and "TWAMP"), which are described in "One-Way Active Measurement Protocol (OWAMP)," Stanislav Shalunov et al., October 2004, Internet Draft http://www.ietf.org/internet-drafts/draft-ietf-ipom-owdp-11.txt and "Two-Way Active Measurement Protocol (TWAMP)," K. Hedayat et al., July 2005, Internet Draft http://www.ieff.org/internet-drafts/draft-hedavat-two-wav-active-measurement-protocol-0.1.txt, respectively, both of which are hereby incorporated by reference in their entireties.

Monitor subsystem 140 may include or be in the form of one or more monitoring probes distributed over network 150. For example, monitoring probes may be located at nodes 170 and configured to monitor performance of network service over links 170 connecting nodes 170.

Monitor subsystem 140 may be used to monitor network performance parameters for actual or simulated traffic. Accordingly, information generated by monitor subsystem 140 can be used to determine improvements in efficiency (e.g., link utilization efficiency) introduced by dynamic real-location of bandwidth between classes of service. The information may also be used for determining when to invoke dynamic queue weighting, for adjusting predefined provisioned bandwidth thresholds, and/or for determining adjustments to queue weighting factors, as described below.

D. Admission Control Subsystem

Admission control subsystem 130 may include one or more devices (e.g., servers) configured to communicate with provisioning subsystem 120, monitor subsystem 140, and network controller 160. Admission control subsystem 130 may employ any suitable communication technologies for communicating with provisioning subsystem 120, monitor subsystem 140, and network controller 160.

As mentioned previously, admission control subsystem 130 may be configured to receive service request and network status information from provisioning subsystem 120. Admission control subsystem 130 may also receive network performance information (e.g., link utilization per class of service) from monitor subsystem 140. Admission control subsystem 130 can use the information to determine path, admission, and dynamic bandwidth queue allocation adjustment for a service request.

When a network service request is received from provisioning subsystem 120, admission control subsystem 130 may determine a path over which to route the service request. Any suitable routing techniques may be used to determine a path for a network service, including any routing techniques known to those skilled in the art.

A path determination may be based on the available bandwidth per class of service on each link 180 along one or more potential paths. The available bandwidth per class of service may be determined from information maintained by provisioning subsystem 120, including the current amount of allocated and provisioned bandwidth per class of service. In certain embodiments, the available bandwidth per class of service is the bandwidth allocated to the class of service that is not currently provisioned. Admission control subsystem 120 may be configured to select a path by assigning a requested network service to a spanning tree instance defining a path having the most available bandwidth for the class of service corresponding to the requested network service. By way of example, if a request is for a network service between nodes 170-1 and 170-2 of FIG. 1, admission control subsystem 130 may be configured to select and assign either the path formed by link 180-1 or the path formed links 180-2 and 180-3, based on which of the two paths has more available bandwidth for the requested class of service. In certain embodiments, if a selected path is determined not to have sufficient bandwidth available for the requested class of service, admission control subsystem 130 may be configured to consider other potentially suitable paths.

For each link of a selected path, admission control subsystem 130 may determine whether to invoke dynamic queue weighting. Admission control subsystem 130 may be configured to invoke dynamic queue weighting when a predefined condition has been satisfied. Any number (i) of service request received subsequently to initial bandwidth allocation may cause the predefined condition to be satisfied. The predefined condition may include one or more criteria, or combinations of criteria, configured to trigger invocation of dynamic queue weighting on an on-going basis, periodically, or on a case-by-case basis. The predefined condition may be applied globally for all links 180 of network 150 or on a link-by-link basis. Accordingly, different predefined conditions may be applied to different links 180. Several exemplary predefined conditions configured to invoke dynamic queue weighting will now be described. However, the exemplary predefined conditions are not limiting, and any suitable condition may be defined and used by admission control subsystem 130 to determine when to invoke dynamic queue weighting.

1. Exemplary Predefined Conditions

In certain embodiments, the predefined condition may include a service request causing one or more predefined provisioned bandwidth thresholds to be reached. Accordingly, admission control subsystem 130 may be configured to invoke dynamic queue weighting upon determining that a predefined provisioned bandwidth threshold has been reached.

Each class of service to which bandwidth queue weighting is applied may be assigned a predefined provisioned bandwidth threshold. The threshold may be defined in any suitable terms, including a percentage (e.g., twenty-five percent (25%)) of allocated bandwidth that is provisioned per class of service. In certain embodiments, when the predefined provisioned bandwidth threshold is reached for any relevant class of service (i.e., a class of service to which bandwidth queue weighting is applied), admission control subsystem 130 is configured to invoke dynamic queue weighting.

Before the predefined provisioned bandwidth threshold is reached, admission control subsystem 130 may be configured to provision service requests when sufficient class-of-service bandwidth is available, without reallocating bandwidth among classes of service. In other words, if the predefined condition is not satisfied, the requested service may be provisioned on the requested class of service without reallocation bandwidth between classes of service. This allows sufficient bandwidth to be provisioned in each class of service before adjusting bandwidth allocations, thereby preventing reallocations of bandwidth from being based on extreme bandwidth provisioning ratios that may be present when an insufficient number of service requests have been provisioned on a link.

In addition to one or more predefined provisioned bandwidth thresholds, the predefined condition may include one or more additional criteria configured to be used by admission control subsystem 130, after dynamic queue weighting has been initially invoked, to determine instances in which dynamic queue weighting will be performed. In certain embodiments, for example, the predefined condition may include a frequency indicator configured to be used to determine, once dynamic queue weighting has been initiated, how often dynamic queue weighting will be performed. The frequency indicator may include a predefined number (n) that represents a frequency of application. Once dynamic queue weighting has been initiated, admission control subsystem 130 may apply dynamic queue weighting to every $n^{th}$ number of service requests. Thus, if the predefined number (n) has a value of one ("1"), dynamic queue weighting will be performed for each subsequent request for a relevant class of service. The predefined number (n) may be increased to reduce overhead costs associated with performing dynamic queue weighting for every service request.

In certain other embodiments, the predefined condition may include predefined incremental provisioned bandwidth thresholds within each relevant class of service. The predefined incremental provisioned bandwidth thresholds may be arranged to form a tier of thresholds. Accordingly, dynamic queue weighting may be performed whenever a tier (i.e., a predefined incremental provisioned bandwidth threshold) is reached. Accordingly, admission control subsystem 130 can dynamically adjust bandwidth allocations whenever one of the predefined incremental provisioned bandwidth thresholds is reached.

In addition, each of the predefined provisioned bandwidth thresholds described above may be configured to trigger different variations and/or functions of dynamic queue weighting. For example, a first predefined provisioned bandwidth threshold may be configured to trigger a version of dynamic queue weighting that keeps processing costs low by omitting validation functions. Exemplary validation functions will be described further below. Validation functions may be omitted at relatively lower predefined provisioned bandwidth thresholds because there is minimal chance of a bandwidth reallocation causing violation of service level agreements for currently provisioned traffic. A second predefined provisioned bandwidth threshold may be configured to trigger a version of dynamic queue weighting that includes validation functions. It may be desirable to invoke dynamic queue weighting validation functions when there is an increased likelihood of bandwidth reallocations causing violations of service level agreements (e.g., provisioned bandwidth is approaching the allocated bandwidth).

Admission control subsystem 130 may be configured to adjust any of the provisioned bandwidth thresholds described above based on actual bandwidth utilization, as determined by monitor subsystem 140. For example, admission control subsystem 130 may adjust a predefined provisioned bandwidth threshold based on a relationship between the threshold and actual bandwidth utilization. An example of such relationship may include the bandwidth utilization being with a predetermined amount of the provisioned bandwidth threshold. Accordingly, an invocation of dynamic queue weighting may be based on the amounts of both provisioned and utilized bandwidth, including comparisons of provisioned bandwidth to utilized bandwidth.

By way of another example of a predefined condition, in certain embodiments, the predefined condition may include a service request causing one or more predefined bandwidth utilization thresholds to be reached. Accordingly, admission control subsystem 130 may be configured to invoke dynamic queue weighting upon determining that a predefined bandwidth utilization threshold has been reached. Actual bandwidth utilization may be determined by monitor subsystem 140, as described above.

By way of another example of a predefined condition, in certain embodiments, the predefined condition may include a determination that a requested class of service does not have sufficient bandwidth available to support provisioning of a requested service. Accordingly, admission control subsystem 130 may be configured to invoke dynamic queue weighting upon determining that insufficient bandwidth is available for provisioning a requested class of service. The determination may be made on a link-by-link basis.

The invocation of dynamic queue weighting in response to a determination that insufficient bandwidth is available for a service request provides an additional option before having to either deny the service request or request (and pay for) additional bandwidth capacity on a link 180. Consequently, when dynamic queue weighting is able to reallocate bandwidth in a manner that allows a service request to be provisioned, link utilization is improved and costs are reduced because a request for additional bandwidth capacity can be prevented or at least prolonged.

The predefined condition for triggering invocation of dynamic queue weighting may include any one of, or combination of, the exemplary conditions described above. Similarly, the predefined condition may include any combination of one or more of the above-described conditions with one or more other suitable conditions.

2. Exemplary Bandwidth Reallocation

If the predefined condition is not satisfied, admission control subsystem 130 may initiate provisioning of a service request in any suitable manner, when sufficient bandwidth is available for provisioning of the service request. For example, admission control subsystem 130 may notify provisioning subsystem 120 that the service request has been approved. Provisioning subsystem 120 may instruct network controller 160 to provision the service request, as described above.

Once it is determined that the predefined condition is satisfied (i.e., dynamic queue weighing will be applied), admission control subsystem 130 may reallocate bandwidth between different classes of service. Bandwidth reallocation may be performed for the service request that caused the predefined condition to be satisfied. Alternatively, the service request that caused the predefined condition to be satisfied may be provisioned, and dynamic queue weighting may be applied to a subsequent service request (e.g., the immediately subsequent service request for the same class of service or for a different class of service).

Bandwidth may be reallocated by adjusting queue weighting factors for the relevant classes of service. In certain embodiments, admission control subsystem 130 is configured to adjust the queue weighting factors based on a ratio of bandwidth provisioned between the relevant classes of service. The ratio may represent either the current amounts of provisioned bandwidth before the service request under consideration is provisioned or amounts of bandwidth that will be provisioned once the service request under consideration is provisioned.

By way of example, an initial ratio of bandwidth allocation between a first class of service and a second class of service may be approximately four to one (4:1), meaning that four times the bandwidth is allocated to the first class of service as is allocated to the second class of service. When it is determined that the predefined condition is satisfied, admission control subsystem 130 can reallocate bandwidth between the first and second classes of service based on a ratio of bandwidth provisioned for each of the classes of service. For example, the amount of bandwidth currently provisioned for the first class of service may be approximately eight times the amount of bandwidth currently provisioned for the second class of service. In this case, admission control subsystem 130 may adjust queue weighting factors to values representative of the eight-to-one ratio (8:1). Consequently, the initial ratio (i.e., 4:1) of bandwidth allocated between the first and second classes of service is adjusted to an eight-to-one ratio (8:1), meaning that approximately eight times the bandwidth is allocated to the first class of service as is allocated to the second class of service.

In other words, if the initial allocation of bandwidth is approximately eight-hundred (800) Megabits per second to the first class of service and two-hundred (200) Megabits per second to the second class of service (a four-to-one ratio), the adjusted allocation of bandwidth will be approximately eight-hundred-eighty-nine (889) Megabits per second to the first class of service and approximately one-hundred-eleven (111) Megabits per second to the second class of service (approximately an eight-to-one (8:1) ratio). Note in this example that the total bandwidth available for allocation between the first and second classes of service remains unchanged at one-thousand (1,000) Megabits per second. Admission control subsystem 130 may be configured to account for changes to the total bandwidth available for allocation between classes of service.

By reallocating bandwidth between classes of service based on a ratio of the bandwidth provisioned to the classes of service, forecasted ratios can be adjusted to represent actual network demands. Accordingly, deviations from forecasted traffic patterns are less likely to cause network problems (e.g., link failure).

Adjustment values for queue weighting factors may be based on other suitable factors. For example, admission control subsystem 130 may be configured to adjust the queue weighting factors based on a ratio of bandwidth utilized between the relevant classes of service. By way of another example, admission control subsystem 130 may be configured to adjust the queue weighting factors based on both bandwidth provisioned and bandwidth utilized on the respective queues. Bandwidth utilization may be determined by monitor subsystem 140 as described above.

Once adjusted values for queue weighting factors have been determined, admission control subsystem 130 may be configured to initiate adjustments of the queue weighting factors for the relevant classes of service. For example, admission control subsystem 130 can send instructions for queue weighting adjustments to network controller 160, which may instruct one or more nodes 170 to adjust values of queue weighting factors in accordance with the instructions. The adjustments may be performed dynamically and automatically, without human intervention. Admission control subsystem 130 may initiate provisioning of a pending service request either before or after queue weighting factors have been adjusted. The service request may be provisioned as described above.

3. Exemplary Validation

In certain embodiments, admission control subsystem 130 may be configured to perform one or more predefined validations before instructing network controller 160 to adjust queue weighting factors. Based on the results of the validations, admission control subsystem 130 may elect to adjust queue weighting factors, not to adjust queue weighting factors, or to fine tune the queue weighting factors to be used to reallocate bandwidth.

For example, admission control subsystem 130 may be configured to validate that sufficient available bandwidth exists in a donor class of service to support a proposed bandwidth reallocation. This validation prevents service level agreements for the donor class from being violated by a reallocation of bandwidth from the donor class of service to another class of service. In other words, sufficient bandwidth should remain allocated to the donor class of service to support current service demands for the donor class of service.

In certain embodiments, validating the availability of sufficient donor class bandwidth includes determining whether the amount of bandwidth that will remain allocated to the donor class of service after reallocation is less than the amount of bandwidth provisioned on the donor class of service. If it is determined that the remaining allocated bandwidth will be less than the provisioned bandwidth for the donor class of service, the donor class of service is determined not to have sufficient bandwidth available for the proposed bandwidth reallocation.

In certain other embodiments, validating the availability of sufficient donor class bandwidth includes determining whether the amount of bandwidth that will remain allocated to the donor class of service after reallocation is less than a cushion above the amount of bandwidth provisioned on the donor class of service. If it is determined that the remaining allocated bandwidth will be less than the sum of the provisioned bandwidth and the cushion for the donor class of service, the donor class of service is determined not to have sufficient bandwidth available for the proposed bandwidth reallocation. The cushion may be predefined or may be calculated. In certain embodiments, for example, the cushion may be set to a predefined percentage (e.g., ten percent (10%)) of the total amount of bandwidth available for allocation between relevant classes of service. The total available bandwidth may be determined by summing the available bandwidth (i.e., allocated bandwidth minus provisioned bandwidth) for each relevant class of service.

Admission control subsystem 130 may be configured to perform any of several options in response to a determination that the donor class of service does not to have sufficient bandwidth available for the proposed bandwidth reallocation. In certain embodiments, admission control subsystem 130 may elect not to reallocate bandwidth. Accordingly, the service request may be denied if insufficient bandwidth exists for provisioning in the requested class of service, or the service request may be provisioned without performing bandwidth reallocation if sufficient bandwidth exists in the requested class or service. In other embodiments, admission control subsystem 130 may be configured to request additional bandwidth capacity from network 150 and to put the service request in a "wait state" while waiting for additional bandwidth capacity to be provided.

In other embodiments, admission control subsystem 130 may be configured to adjust the proposed bandwidth reallocation. For example, the reallocation may be adjusted so as to reduce the amount of bandwidth to be reallocated from a donor class of service to the requested class of service. The reduction may be by a predefined or calculated amount. For example, admission control subsystem 130 may be configured to determine the adjustment to be made to bring the amount of post-reallocation bandwidth for the donor class to be equal to or greater than the bandwidth provisioned (or the sum of the bandwidth provisioned and the cushion) for the donor class of service The adjustment may be limited by a predefined maximum variation threshold, which may be defined to restrict the extent of variation from the ratio used to determine the proposed bandwidth reallocation. In other embodiments, admission control subsystem 130 may be configured to override the cushion to attempt to free up enough available bandwidth to support the proposed bandwidth reallocation. If allowable adjustments or overrides still fail to cause the donor class of service to have sufficient bandwidth available for the proposed bandwidth reallocation, admission control subsystem 130 may be configured to deny the service request or to request additional bandwidth capacity, as described above.

In certain embodiments, admission control subsystem 130 may be configured to consider alternative donor classes of service and/or combinations of donor classes of service until either identification of a class of service (or combination of classes of service) having sufficient bandwidth for reallocation or a determination that there is no suitable class a service (or combination of classes of service) having sufficient bandwidth to support a bandwidth reallocation.

On the other hand, if the donor class of service is determined to have sufficient bandwidth available for the proposed bandwidth reallocation, admission control subsystem 130 may be configured to adjust queue weighing factors accordingly and provision the requested service, or admission control subsystem 130 may be configured to perform one or more additional validations. For example, admission control subsystem 130 may be configured to determine whether the proposed bandwidth reallocation will provide sufficient bandwidth for provisioning of the requested class of service. Admission control subsystem 130 may make this determination by determining the total amount of bandwidth that will be allocated to the requested class of service as a result of execution of the proposed bandwidth allocation. This total amount of bandwidth may then be compared with the sum of the amount of bandwidth being requested for the service request and the amount of currently provisioned bandwidth for the same class of service. If the total amount of allocated bandwidth is greater than or equal to the sum of provisioned bandwidth for the requested class of service, the proposed reallocation of bandwidth will be determined to provide sufficient bandwidth for the provisioning of the requested service. Admission control subsystem 130 may then initiate execution of the proposed bandwidth reallocation by initiating adjustments of the queue weighting factors for the relevant classes of service, as described above. Once the proposed bandwidth reallocation has been performed, system 100 may provision the corresponding service request, as described above.

On the other hand, if it is determined that the proposed reallocation of bandwidth will not provide sufficient bandwidth for the provisioning of the requested service (e.g., the proposed allocated bandwidth is less than the sum of provisioned bandwidth for the requested class of service), admission control subsystem 130 may be configured to perform any of several options. In certain embodiments, admission control subsystem 130 may elect not to reallocate bandwidth. Accordingly, the service request may be denied, as described above. In other embodiments, admission control subsystem 130 may be configured to request additional bandwidth capacity from network 150 and to put the service request in a "wait state" while waiting for additional bandwidth capacity to be provided.

In other embodiments, admission control subsystem 130 may be configured to fine tune the proposed bandwidth reallocation. For example, admission control subsystem 130 may be configured to increase the amount of bandwidth to be reallocated to the requested class of service. The increase may be by a predefined (e.g., a predefined increment) or calculated amount. For example, admission control subsystem 130 may be configured to determine the adjustment to be made to bring the amount of post-reallocation bandwidth for the requested class to be equal to or greater than the total bandwidth provisioned for the requested class of service after the service request is provisioned. The adjustment may be limited by a predefined maximum variation threshold, which may be defined to restrict the extent of variation from the ratio used to determine the proposed bandwidth reallocation. If allowable adjustments still fail to cause the requested class of service to have sufficient bandwidth available for provisioning of the service request, admission control subsystem 130 may be configured to deny the service request or to request additional bandwidth capacity, as described above.

III. Exemplary Queue Configuration and Bandwidth Reallocation

Figure 2:
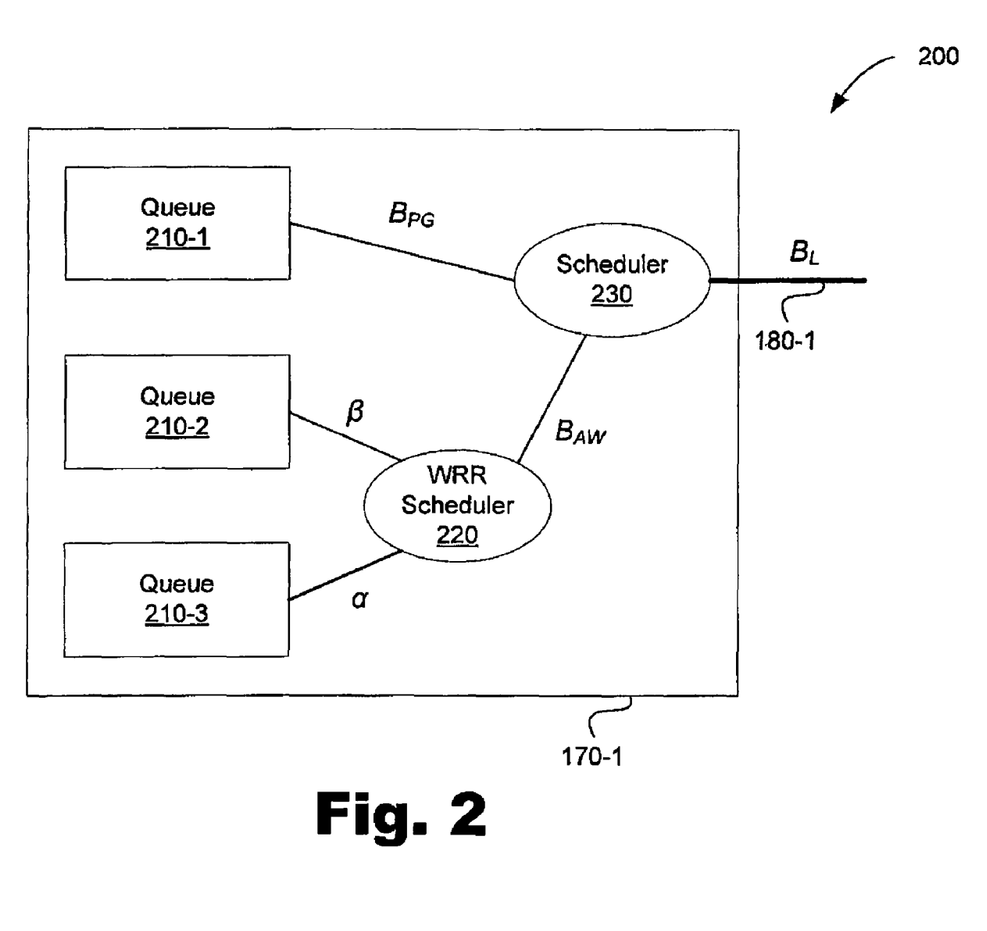
FIG. 2 is a block diagram illustrating an exemplary queue configuration at a node of FIG. 1, according to an embodiment.

FIG. 2 illustrates an exemplary queue configuration 200 that may be implemented at a node (e.g., node 170-1) of FIG. 1, according to an embodiment. As shown in FIG. 2, node 170-1 may include queue 210-1, 210-2, and 210-3 (collectively "queues 210") configured to line up service requests for provisioning over link 180-1. A class of service may be mapped to each of queues 210. For example, a first class of service referred to as a "gold" service class may be mapped to queue 210-1, a second class of service referred to as a "silver" service class may be mapped to queue 210-2, and a third class of service referred to as a "bronze" service class may be mapped to queue 210-3.

The bandwidth capacity (referred to as "$B_L$") of link 180-1 may be allocated among the different classes of service. For example, services associated with the "gold" service class may be given strict priority status, thereby providing low loss, jitter, and delay. Accordingly, provisioned "gold" class services, represented as "$B_{PG}$" in FIG. 2, use a portion of the bandwidth capacity ($B_L$) of link 180-1. Scheduler 230 may be configured to schedule provisioning of "gold" class services over link 180-1. In certain embodiments, scheduler 230 is configured to give strict priority to "gold" services.

Accordingly, the remainder of the bandwidth capacity ($B_{AL}$) not provisioned to the "gold" service class (i.e., $B_{AL}$ minus $B_{PG}$), represented as "$B_{AW}$" in FIG. 2, is available for other classes of service (i.e., the "silver" and "bronze" service classes). As shown in FIG. 2, the remainder of the bandwidth ($B_{AW}$) may be divided between the "silver" and "bronze" classes of service. Weighted round-robin ("WRR") scheduler 220 may be configured to control allocations of bandwidth ($B_{AW}$) between the "silver" and "bronze" classes of service. For example, WRR scheduler 220 may be configured with weighting factors corresponding with each queue (i.e, queues 210-2 and 210-3) feeding into the WRR scheduler 220. WRR scheduler 220 schedules requests for bandwidth ($B_{AW}$) in accordance with the values of the queue weighting factors As shown in FIG. 2, the bandwidth ($B_{AW}$) feeds into scheduler 230, which may schedule the provisioning of "gold," "silver," and "bronze" services over link 180-1.

Queue weighting factors represented as "$\alpha$" and "$\beta$" may be set in WRR scheduler 220 and used to dictate allocation of bandwidth ($B_{AW}$) between the "silver" and "bronze" classes of service. Accordingly, "$\alpha$" and "$\beta$" represent the weighting factors assigned to queue 210-3 and queue 210-2, respectively. The values of "$\alpha$" and "$\beta$" may be used to determine the amount of bandwidth allocated to the "bronze" service class (represented as "$B_{ABRONZE}$") and the amount of bandwidth allocated to the "silver" service class (represented as "$B_{ASILVER}$"). In certain embodiments, "$B_{ABRONZE}$" is determined in accordance with Equation 1, and "$B_{ASILVER}$" is determined in accordance with Equation 2.

$$B_{ABRONZE} = \left(\frac{\alpha}{\alpha+\beta}\right) \times B_{AW} \quad \text{Equation 1}$$

$$B_{ASILVER} = \left(\frac{\beta}{\alpha+\beta}\right) \times B_{AW} \quad \text{Equation 2}$$

As described above, queue weighting factors (e.g., "$\alpha$" and "$\beta$") may be set initially based on forecasted service demands. For example, "$\alpha$" may be set to an initial value of "4.0," and "$\beta$" may be set to an initial value of "1.0" to allocate bandwidth ($B_{AW}$) between the "bronze" and "silver" service classes based on forecasted demands. Accordingly, "$B_{AW}$" will be allocated at a four-to-one (4:1) ratio between the "bronze" to "silver" service classes, respectively.

After initialization and upon satisfaction of a predefined condition (described above), "$\alpha$" and "$\beta$" may be adjusted in any of the ways described herein to dynamically change the initial allocation of the bandwidth ($B_{AW}$) between queues 210-3 and 210-2. For example, if the predefined condition includes the amount of provisioned bandwidth for a class of service reaching a predefined provisioned bandwidth threshold, "a" and may be adjusted when the predefined provisioned bandwidth threshold for either the "bronze" or the "silver" service classes is reached. For instance, if each of the "bronze" and the "silver" service classes is assigned a predefined provisioned bandwidth threshold set to fifty percent (50%) of allocated bandwidth to the respective service class, "$\alpha$" and "$\beta$" may be adjusted when, for either the "bronze" or the "silver" service class, fifty percent (50%) of the allocated bandwidth is provisioned.

By way of a numerical example, if it is assumed that the bandwidth capacity ($B_L$) of link 180-1 is one-thousand (1,000) Megabits per second ("Mbps") and one-hundred (100) Mbps of the bandwidth has been provisioned for the "gold" class of service ($B_{PG}$), nine-hundred (900) Mbps is available ($B_{AW}$) for allocation between the "bronze" and "silver" service classes. With "$\alpha$" and "$\beta$" set to the initial four-to-one (4:1) ratio, the "bronze" service class is allocated seven-hundred-twenty (720) Mbps, and the "silver" service class is allocated one-hundred-eighty (180) Mbps.

With predefined provisioned bandwidth thresholds set to fifty percent (50%) of allocated bandwidth, the predefined provisioned bandwidth threshold for the "bronze" service class is three-hundred-sixty (360) Mbps, and the predefined provisioned bandwidth threshold for the "silver" service class is ninety (90) Mbps. If it is assumed that the current amounts of provisioned bandwidth for the "bronze" and "silver" classes of service are three-hundred-fifty (350) Mbps and fifty (50) Mbps, respectively, and a "bronze" service request for twenty (20) Mbps is received, system 100 will determine that provisioning of the service request will increase the amount of "bronze" provisioned bandwidth to three-hundred-seventy (370) Mbps, an amount greater than the predefined provisioned bandwidth threshold. Accordingly, dynamic queue weighting may be invoked to adjust "$\alpha$" and "$\beta$."

As described above, queue weighting factors may be adjusted based on a ratio of provisioned bandwidth between classes of service. The ratio may be based on pre-provisioning or post-provisioning amounts of bandwidth. In this case, for example, "$\alpha$" and "$\beta$" may be adjusted based on the post-provisioning amounts of bandwidth in the "bronze" (i.e., three-hundred-seventy (370) Mbps) and "silver" (i.e., fifty (50) Mbps) service classes. These values represent approximately a 7.4-to-one (7.4:1) ratio. Accordingly, "$\alpha$" may be adjusted to a value of 7.4, and "$\beta$" may be adjusted to a value of one (1). From Equation 1 and Equation 2, it is determined that the adjusted amounts of bandwidth allocated to the "bronze" and "silver" service Classes is approximately seven-hundred-ninety-three (793) Mbps and one-hundred-seven (107), respectively. Of course, these amounts may be rounded in certain embodiments.

After bandwidth reallocation and provisioning of the service request, four-hundred-twenty-three (423) Mbps will be available on the "bronze" queue 210-3 (i.e., seven-hundred-ninety-three (793) Mbps allocated bandwidth subtract three-hundred-seventy (370) Mbps provisioned bandwidth), and fifty-seven (57) Mbps will be available on the "silver" queue 210-2 (i.e., one-hundred-seven (107) Mbps allocated bandwidth subtract fifty (50) Mbps provisioned bandwidth). Accordingly, the ratio of the amounts of available bandwidth for the "bronze" and "silver" service classes can be adjusted to account for current service demands instead of being fixed at an initial value that is based on forecasted service demands.

While FIG. 2 illustrates a particular queue configuration, this is not limiting. Any suitable queue configuration may be used in which bandwidth may be allocated between different classes of service in accordance with weighting factors. For example, dynamic queue weighting may be application to any suitable number of queues feeding into a weighted-round-robin scheduler.

IV. Exemplary Process View

Figure 3:
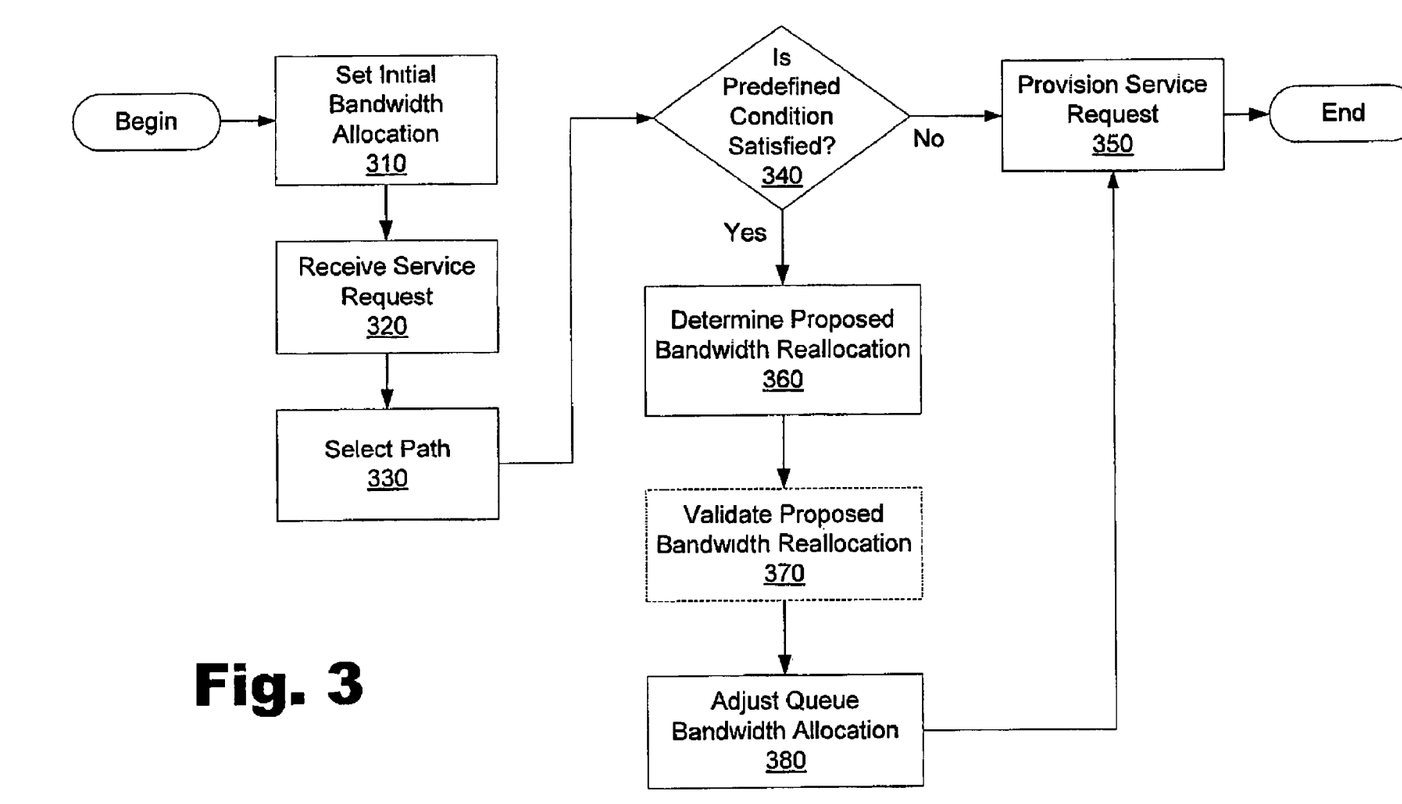
FIG. 3 is a flowchart illustrating an exemplary method for provisioning service requests on the network of FIG. 1, including dynamically adjusting bandwidth allocations between different classes of service, according to an embodiment.

FIG. 3 is a flowchart illustrating an exemplary method for provisioning service requests on the network of FIG. 1, including dynamically adjusting bandwidth allocations between different classes of service, according to an embodiment. While FIG. 3 illustrates exemplary steps according to one embodiment, other embodiments may omit, add to, and/or modify any of the steps shown in FIG. 3.

The process of FIG. 3 begins by setting an initial bandwidth allocation in step 310. Step 310 may be performed in any of the ways described above, including setting queue weighting factors to initial values.

In step 320, a service request is received. Step 320 may be performed in any of the ways described above, including provisioning subsystem 120 receiving a request (e.g., request 190) and forward information included in the request to admission control subsystem 130.

In step 330, a path is selected for the service request. Step 330 may be performed in any of the ways described above, including admission control subsystem 130 determining a path over network 150.

In step 340, it is determined whether a predefined condition has been satisfied. Step 340 may be performed in any of the ways described above, including comparing current one or more network parameters (e.g., amount of provisioned bandwidth) with a predefined provisioned bandwidth threshold or with an amount of bandwidth allocated or available for a class of service.

If it is determined in step 340 that the predefined condition has not been satisfied, processing will move to step 350. In step 350, the requested service is provisioned. Step 350 may be performed in any of the ways described above, including provisioning the service on one or more links 180 of network 150.

On the other hand, if it is determined in step 340 that the predefined condition has been satisfied, dynamic queue weighting will be invoked by continuing processing at steps 360 through 380. In step 360, a proposed bandwidth reallocation is determined. Step 360 may be performed in any of the ways described above, including calculating a new allocation ratio based on a ration of provisioned bandwidth between classes of service.

In step 370, the proposed bandwidth reallocation is validated. Step 370 may be performed in any of the ways described above, including determining whether sufficient bandwidth is available in a donor class or service and/or determining whether the proposed bandwidth reallocation will provide sufficient bandwidth for the requested class of service. If the proposed bandwidth reallocation fails to pass a validation test, admission control subsystem 130 may adjust the proposed bandwidth request as described above. If the adjusted proposed bandwidth allocation continues to fail a validation test, admission control subsystem 130 may deny the service request or put the service request in a "wait state" while additional bandwidth capacity is requested, as described above. The method of FIG. 3 would end at this point until either additional bandwidth capacity is provided or a new service request is received.

If the proposed bandwidth reallocation is validated in step 370, the actual bandwidth queue allocation is adjusted in step 380. Step 380 may be performed in any of the ways described above, including adjusting queue weighting factors.

It should be noted that in the method of FIG. 3, step 370 is optional, as represented by dashed lines. Accordingly, in certain embodiments, validation may be omitted and the method of FIG. 3 may move from step 360 directly to step 380.

Once bandwidth queue allocations have been adjusted in step 380, processing moves to step 350. In step 350, the requested service is provisioned as described above.

The method of FIG. 3 may then wait for another service request. When another service request is received, the method may be configured to repeat beginning at step 320.

V. Alternative Embodiments

The preceding description has been presented only to illustrate and describe embodiments of the invention. It is not intended to be exhaustive or to limit the invention to any precise form disclosed. The invention may be practiced otherwise than is specifically explained and illustrated without departing from its spirit or scope. It is intended that the scope of the invention be defined by the following claims.

What is claimed is:

1. A system comprising:
a plurality of queues each associated with one of a plurality of classes of service and configured to share an amount of bandwidth, the amount of bandwidth being allocated between said plurality of queues in accordance with a plurality of queue weighting factors associated with said plurality of queues, each said weighting factor defining a ratio of allocated bandwidth between one of said plurality of queues and another of said plurality of queues; and
an admission control subsystem configured to
receive a request for an amount of bandwidth of one of said plurality of classes of service,
determine based on said request whether a predefined condition is satisfied, said predefined condition including an amount of bandwidth for a class of service reaching a predefined bandwidth threshold, and
invoke dynamic queue weighting to dynamically adjust said plurality of queue weighting factors based on a ratio of bandwidth provisioned between said plurality of queues when said predefined condition has been satisfied, wherein once dynamic queue weighting has been invoked, said admission control subsystem applies dynamic queue weighting to every nth number of service requests according to a number (n), wherein said number (n) is greater than one.

2. The system of claim 1, wherein each of said plurality of queues is associated with a different class of service.

3. The system of claim 1, wherein said predefined condition includes an amount of bandwidth provisioned on at least one of said plurality of queues reaching a predefined provisioned bandwidth threshold associated with the same one of said plurality of queues.

4. The system of claim 3, further comprising a monitor subsystem configured to determine current bandwidth utilization on said plurality of queues, wherein said admission control subsystem is further configured to adjust said predefined provisioned bandwidth threshold based on a relationship between the determined current bandwidth utilization and the bandwidth provisioned on the same one of said plurality of queues.

5. The system of claim 1, wherein said predefined condition includes satisfaction of a determination that a service request will cause an amount of bandwidth provisioned on at least one of said plurality of queues to reach either an amount of bandwidth allocated to the same one of said plurality of queues or a predefined provisioned bandwidth threshold associated with the same one of said plurality of queues.

6. The system of claim 1, wherein said predefined condition includes a request for a class of service mapped to one of said plurality of queues, the request being for more bandwidth than is available on the same one of said plurality of queues.

7. The system of claim 1, wherein said admission control subsystem is further configured to
determine a proposed bandwidth reallocation, and
validate said proposed bandwidth reallocation before adjusting said plurality of queue weighting factors.

8. The system of claim 7, wherein said proposed bandwidth reallocation is indicative of an amount of bandwidth to be reallocated from at least one of said plurality of queues to at least one other of said plurality of queues, and said admission control subsystem is configured to validate said proposed bandwidth reallocation by performing at least one of
determining that sufficient bandwidth is available in said at least one of said plurality of queues to support said proposed bandwidth reallocation, and
determining that said proposed bandwidth reallocation will provide sufficient bandwidth in said at least one other of said plurality of queues to support provisioning of a requested service.

9. The system of claim 1, wherein said admission control subsystem is further configured to
determine a proposed bandwidth reallocation,
determine when insufficient bandwidth is available to support said proposed bandwidth reallocation, and
fine tune said proposed bandwidth reallocation when it is determined that insufficient bandwidth is available to support said proposed bandwidth reallocation.

10. The system of claim 1, wherein said ratio of bandwidth provisioned between said plurality of queues represents the current amounts of provisioned bandwidth before the request under consideration is provisioned.

11. The system of claim 1, wherein said ratio of bandwidth provisioned between said plurality of queues represents the amounts of bandwidth that will be provisioned once the request under consideration is provisioned.

12. The system of claim 1, wherein said admission control subsystem is further configured to account for changes to the total bandwidth available for allocation between the plurality of classes of service.

13. The system of claim 1, wherein said predefined condition further includes a frequency indicator configured to be used to determine, once dynamic queue weighting has been invoked, how often dynamic queue weighting will be performed.

14. The system of claim 13, wherein said frequency indicator includes said number (n).

15. The system of claim 1, wherein said predefined condition includes predefined incremental provisioned bandwidth thresholds within at least one class of service, said predefined incremental provisioned bandwidth thresholds arranged to form a tier of thresholds such that dynamic queue weighting is invoked whenever the amount of bandwidth for a class of service reaches one of the predefined incremental provisioned bandwidth threshold tiers.

16. A method comprising:
defining a weighted allocation of an amount of bandwidth between a plurality of queues to which a plurality of classes of service are mapped by setting a plurality of queue weighting factors, each queue weighting factor defining a ratio of allocated bandwidth between one of said plurality of queues and another of said plurality of queues;
receiving a service request for an amount of bandwidth of one of the plurality of classes of service;
determining based on the service request whether a predefined condition is satisfied, the predefined condition including an amount of bandwidth for a class of service reaching a predefined bandwidth threshold; and
invoking dynamic queue weighting to dynamically adjust, using at least one computing device, the weighted allocation based on a ratio of bandwidth provisioned between said plurality of queues when it is determined by the at least one computing device that the predefined condition has been satisfied,
wherein once dynamic queue weighting has been invoked, dynamic queue weighting is applied to every nth number of service requests according to a number (n), wherein said number (n) is greater than one.

17. The method of claim 16, further comprising determining when the predefined condition has been satisfied, including determining when an amount of bandwidth provisioned on at least one of the plurality of queues has reached a predefined provisioned bandwidth threshold associated with the same one of the plurality of queues.

18. The method of claim 16, further comprising:
determining when the service request will cause an amount of bandwidth provisioned on at least one of the plurality of queues to reach either an amount of bandwidth allocated to the same one of the plurality of queues or a predefined provisioned bandwidth threshold associated with the same one of the plurality of queues.

19. The method of claim 16, further comprising:
determining when the service request requests more bandwidth than is available on the same one of the plurality of queues.

20. The method of claim 16, further comprising:
determining a proposed bandwidth reallocation, and
validating the proposed bandwidth reallocation before adjusting the weighted allocation.

21. The method of claim 20, wherein said validating step includes performing at least one of determining that sufficient bandwidth is available in at least one of the plurality of queues to support the proposed bandwidth reallocation, and determining that the proposed bandwidth reallocation will provide sufficient bandwidth in at least one other of the plurality of queues to support provisioning of a requested service.

22. The method of claim 16, further comprising:

determining a proposed bandwidth reallocation;

determining when insufficient bandwidth is available to support the proposed bandwidth reallocation; and fine tuning the proposed bandwidth reallocation when it is determined that insufficient bandwidth is available to support the proposed bandwidth reallocation.

23. The method of claim 22, further comprising limiting said fine tuning of the proposed bandwidth reallocation to a predefined maximum variation from the proposed bandwidth reallocation.

24. A method comprising:

setting initial values for a plurality of queue weighting factors associated with a plurality of queues, each of the plurality of queue weighting factors defining a ratio of allocated bandwidth between one of said plurality of queues and another of said plurality of queues and being configured for use in determining a weighted allocation of an amount of bandwidth between the plurality of queues;

receiving a service request for a class of service mapped to one of the plurality of queues;

determining based on said service request, using at least one computing device, when a predefined condition is satisfied, the predefined condition including an amount of bandwidth for a class of service reaching a predefined bandwidth threshold; and automatically invoking dynamic queue weighting to adjust the initial values of the plurality of queue weighting factors by the at least one computing device when it is determined that the predefined condition has been satisfied, the initial values being adjusted based on a ratio of bandwidth provisioned between the plurality of queues, wherein once dynamic queue weighting has been invoked, dynamic queue weighting is applied to every nth number of service requests according to a number (n), wherein said number (n) is greater than one.

25. The method of claim 24, wherein said determining step includes determining when an amount of bandwidth provisioned on at least one of the plurality of queues has reached a predefined provisioned bandwidth threshold associated with the same one of the plurality of queues.

26. The method of claim 24, wherein said determining step includes determining when the service request will cause an amount of bandwidth provisioned on at least one of the plurality of queues to reach a predefined provisioned bandwidth threshold associated with the same one of the plurality of queues.

27. The method of claim 24, further comprising:

receiving a subsequent service request;

determining that the subsequent service request will cause a second predefined condition to be satisfied; and dynamically adjusting the adjusted values of the plurality of queue weighting factors in response to a determination that the subsequent service request will cause the second predefined condition to be satisfied.

* * * * *